US006650576B2

(12) United States Patent
Nakajima

(10) Patent No.: US 6,650,576 B2
(45) Date of Patent: Nov. 18, 2003

(54) SEMICONDUCTOR MEMORY AND MEMORY BOARD THEREWITH

(75) Inventor: Daiki Nakajima, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/876,423

(22) Filed: Jun. 6, 2001

(65) Prior Publication Data

US 2001/0055230 A1 Dec. 27, 2001

(30) Foreign Application Priority Data

Jun. 7, 2000 (JP) ........................................ 2000-171153

(51) Int. Cl.[7] ................................................ G11C 7/00
(52) U.S. Cl. .................. 365/200; 365/189.03; 365/201; 365/225.7
(58) Field of Search ................................ 365/200, 201, 365/189.03, 225.7

(56) References Cited

U.S. PATENT DOCUMENTS 5,255,228 A * 10/1993 Hatta et al. .................. 365/200
5,726,930 A * 3/1998 Hasegawa et al. .......... 365/145
5,771,195 A * 6/1998 McClure ..................... 365/200
5,818,792 A * 10/1998 Sasaki et al. ........... 365/230.08
5,859,801 A * 1/1999 Poechmueller .............. 365/200
6,175,936 B1 * 1/2001 Higgins et al. ............. 714/711

FOREIGN PATENT DOCUMENTS

JP 7-65598 3/1995

* cited by examiner

Primary Examiner—Richard Elms
Assistant Examiner—Toan Le
(74) Attorney, Agent, or Firm—Darryl G. Walker; Bradley T. Sako

(57) ABSTRACT

A semiconductor memory, enabled to be used efficiently, if defective is provided. The semiconductor memory (100) may include a first memory blocks (3), a second memory block (33) a shutoff signal generation circuit (1), and a switch circuit (2). The shutoff signal generation circuit (1) may include a programmable device (12) that indicates if the memory block (3) is defective. External terminals (DQ0 to DQ7) may be connected to the memory block (3) through the switch circuit (2) when there is no defect and may be disconnected from the memory block (3) when there is a defect.

22 Claims, 12 Drawing Sheets

SEMICONDUCTOR MEMORY AND MEMORY BOARD THEREWITH

TECHNICAL FIELD

The present invention relates generally to a semiconductor memory and a memory board incorporating the semiconductor memory and more particularly to a semiconductor memory designed to be used, if defective, and a memory board incorporating such a semiconductor memory.

BACKGROUND OF THE INVENTION

In manufacturing of semiconductor memory devices, devices containing a defective portion of memory bits can be produced. In almost all such defective memory devices, defects occur in limited portions of the memory circuitry. The remaining portions of the memory device that are not defective can be used without adverse affects. For this reason, there has been a need to find ways of effectively reusing such defective memory devices.

A method for using a defective semiconductor memory device has been disclosed in a Japanese Patent, First Publication, Hei 7-65598. This method is for using defective dynamic random access memories (DRAMs) by incorporating defective memory devices into a semiconductor circuit and will be illustrated with reference to FIG. 12.

Referring now to FIG. 12, a circuit schematic diagram of a conventional semiconductor circuit is set forth and given the general reference character 500.

Semiconductor circuit 500 includes a tri-state switches (501 and 505) and DRAMs (509 and 510). DRAM 509 has a defect on the left side with respect to a center column. DRAM 510 has a defect on the right side with respect to a center column.

Column Address Strobe (/CAS) is used to enable DRAMs (509 and 510). /CAS is input to the input terminal 503 of tri-state switch 501. The output terminal 502 of tri-state switch 501 is connected to DRAM 509. The most significant address bit signal A9 is input to a control terminal 504 of tri-state switch 501. Tri-state switch 501 is enabled (closed) when most significant address bit signal A9 is at the high logic level. When enabled, tri-state switch connects input terminal 503 to output terminal 502. Tri-state switch 501 is disabled (open) when most significant address bit signal A9 is at the low logic level. When disabled, tri-state switch disconnects input terminal 503 from output terminal 502.

Also, /CAS is input to the input terminal 507 of tri-state switch 505. The output terminal 506 of tri-state switch 505 is connected to DRAM 510. The most significant address bit signal A9 is input to a control terminal 508 of tri-state switch 505. Tri-state switch 505 is enabled (closed) when most significant address bit signal A9 is at the low logic level. When enabled, tri-state switch connects input terminal 507 to output terminal 506. Tri-state switch 505 is disabled (open) when most significant address bit signal A9 is at the high logic level. When disabled, tri-state switch disconnects input terminal 507 from output terminal 506.

In this conventional method of using defective DRAMs, the most significant address bit signal A9 successively opens and closes tri-state switches (501 and 505). In this way, DRAMs (509 and 510) are alternately enabled in response to these switching actions. According to this method of using defective memories, DRAMs (509 and 510) are used as a set.

In this conventional method of using defective memory devices, a left-defective DRAM (such as DRAM 509) and a right-defective DRAM (such as DRAM 510) are used as a set. Therefore, in this conventional method of using defective memory devices, it is necessary to know beforehand where the defects are located in each DRAM.

Further, this conventional method of using defective memory devices does not allow use of two left-defective DRAMs or two right-defective DRAMs as one operative DRAM. Accordingly, this conventional method of using defective memory devices has a limited degree of freedom.

In view of the above discussion, it would be desirable to provide a semiconductor memory designed in such a way to enable effective use of a defective memory device. It would also be desirable to provide a memory board incorporating a memory device of such a design.

It would also be desirable to provide a semiconductor memory designed in such a way to eliminate the need to alter the wiring on a memory board to be compatible with the location of defects in a memory device. It would also be desirable to provide a memory board incorporating a memory device of such a design.

It would also be desirable to provide a semiconductor memory designed in such a way to enable its use when defective portions may be found subsequent to packaging of the semiconductor memory or mounting a semiconductor memory device on a memory board. It would also be desirable to provide a memory board incorporating a memory device of such a design.

It would also be desirable to provide a semiconductor memory having reduced power consumption when defective.

SUMMARY OF THE INVENTION

According to the present embodiments, a semiconductor memory can include a first memory block, a second memory block, a shutoff signal generation circuit and a switch circuit. The shutoff signal generation circuit may include a programmable device that can indicate if the first memory block is defective. External terminals may be connected to the first memory block through the switch circuit when there is no defect and may be disconnected form the first memory block when there is a defect. In this way, a defective semiconductor memory may be efficiently used.

According to one aspect of the embodiments, a shutoff circuit can blow an electrical connection between the external terminals and the first memory block when the first memory block is defective. The shutoff circuit can include a shutoff signal generation circuit and a switch circuit.

According to one another aspect of the embodiments, when the first memory block is defective, the shutoff circuit can electrically connect the first memory block and the external terminals in response to a mask signal input externally into the semiconductor memory.

According to another aspect of the embodiments, when the first memory block is defective, the external terminals can be set into a high impedance state.

According to another aspect of the embodiments, when the first memory block is defective, the first memory block may be disabled by a memory stop signal.

According to another aspect of the embodiments, the shutoff circuit can include a state maintaining element and when the first memory block is defective, the state maintaining element may maintain a first state. When the first memory block is not defective, the state maintaining element may maintain a second state. The shutoff circuit may electrically break a connection between the first memory block and the external terminals in response to the state maintaining element maintaining the first state.

According to another aspect of the embodiments, the state maintaining element may include a fuse. The first state may be a fuse blown state and the second state may be a fuse intact state.

According to another aspect of the embodiments, the state maintaining element may include a fuse. The first state may be a fuse intact state and the second state may be a fuse blown state.

According to another aspect of the embodiments, the shutoff circuit can include a fuse blowing circuit that blows a fuse by applying a current to the fuse. The fuse blowing circuit may blow a fuse in response to a fuse blowing signal input into the fuse blowing circuit according to whether or not the first memory block is defective.

According to another aspect of the embodiments, the state maintaining element may be a non-volatile memory.

According to another aspect of the embodiments, the semiconductor memory may further include a second shutoff circuit connected to the second memory block and second external terminals connected to the second shutoff circuit. The second shutoff circuit may electrically disconnect the second external terminals from the second memory block when the second memory block is defective.

According to another aspect of the embodiments, the second shutoff circuit can include a state maintaining element and when the second memory block is defective, the state maintaining element may maintain a first state. When the second memory block is not defective, the state maintaining element may maintain a second state. The shutoff circuit may electrically break a connection between the second memory block and the external terminals in response to the state maintaining element maintaining the first state.

According to one aspect of the embodiments, the shutoff circuit can blow an electrical connection between the second external terminals and the second memory block when the second memory block is defective. The shutoff circuit can include a shutoff signal generation circuit and a switch circuit.

According to one another aspect of the embodiments, when the second memory block is defective, the shutoff circuit can electrically connect the second memory block and the external terminals in response to a mask signal input externally into the semiconductor memory.

According to another aspect of the embodiments, when the second memory block is defective, the second external terminals can be set into a high impedance state.

According to another aspect of the embodiments, when the second memory block is defective, the second memory block may be disabled by a memory stop signal.

According to another aspect of the embodiments, the shutoff circuit can include a shutoff signal generation circuit and a switch circuit. The switch circuit can be coupled between external terminals and a memory block.

According to another aspect of the embodiments, the switch circuit can include tri-state drivers. The switch circuit can receive a shutoff signal that places tri-state drivers in a high-impedance state.

According to another aspect of the embodiments, the shutoff signal generation circuit can include a programmable device. The programmable device may be placed in a first state or second state depending on whether the memory block is defective.

According to another aspect of the embodiments, the shutoff signal generation circuit can receive a externally generated signal for programming the programmable device.

According to another aspect of the embodiments, the shutoff signal generation circuit can include a latch for latching a signal indicative of a state of the programmable device.

According to another aspect of the embodiments, the shutoff signal may be generated by a logical sum of a mask signal and a signal indicating the state of the programmable device.

According to another aspect of the embodiments, a circuit board may have a substrate that may be mounted with the semiconductor memory. The circuit board may include a first wiring connected to first external terminals and a second wiring connected to second external terminals.

According to another aspect of the embodiments, the first and second wirings may be electrically shorted.

According to another aspect of the embodiments, the circuit board may have a defective semiconductor memory and a non-defective semiconductor memory mounted on the substrate.

According to another aspect of the embodiments, a method for inspecting the semiconductor memory includes the steps of inspecting whether or not a first memory block is defective and setting a programmable device in a first state depending on whether or not the first memory block is defective.

According to another aspect of the embodiments, the step of setting a programmable device in a first state includes blowing a fuse depending on whether or not the first memory block is defective.

According to another aspect of the embodiments, the step of setting a programmable device in a first state includes blowing a fuse by applying a current through the fuse depending on whether or not the first memory block is defective.

According to another aspect of the embodiments, the step of setting a programmable device in a first state includes applying a first state programming signal to an external input terminal of the semiconductor memory depending on whether or not the first memory block is defective.

According to another aspect of the embodiments, the method for inspecting the semiconductor memory further includes the of inspecting whether or not a second memory block is defective and setting a second programmable device in a first state depending on whether or not the second memory block is defective.

According to another aspect of the embodiments, the step of setting a second programmable device in a first state includes blowing a fuse depending on whether or not the second memory block is defective.

According to another aspect of the embodiments, the step of setting a second programmable device in a first state includes blowing a fuse by applying a current through the fuse depending on whether or not the second memory block is defective.

According to another aspect of the embodiments, the step of setting a second programmable device in a first state includes applying a first state programming signal to a second external input terminal of the semiconductor memory depending on whether or not the second memory block is defective.

DETAILED DESCRIPTION OF THE EMBODIMENTS

Various embodiments of the present invention will now be described in detail with reference to a number of drawings.

Figure 1:
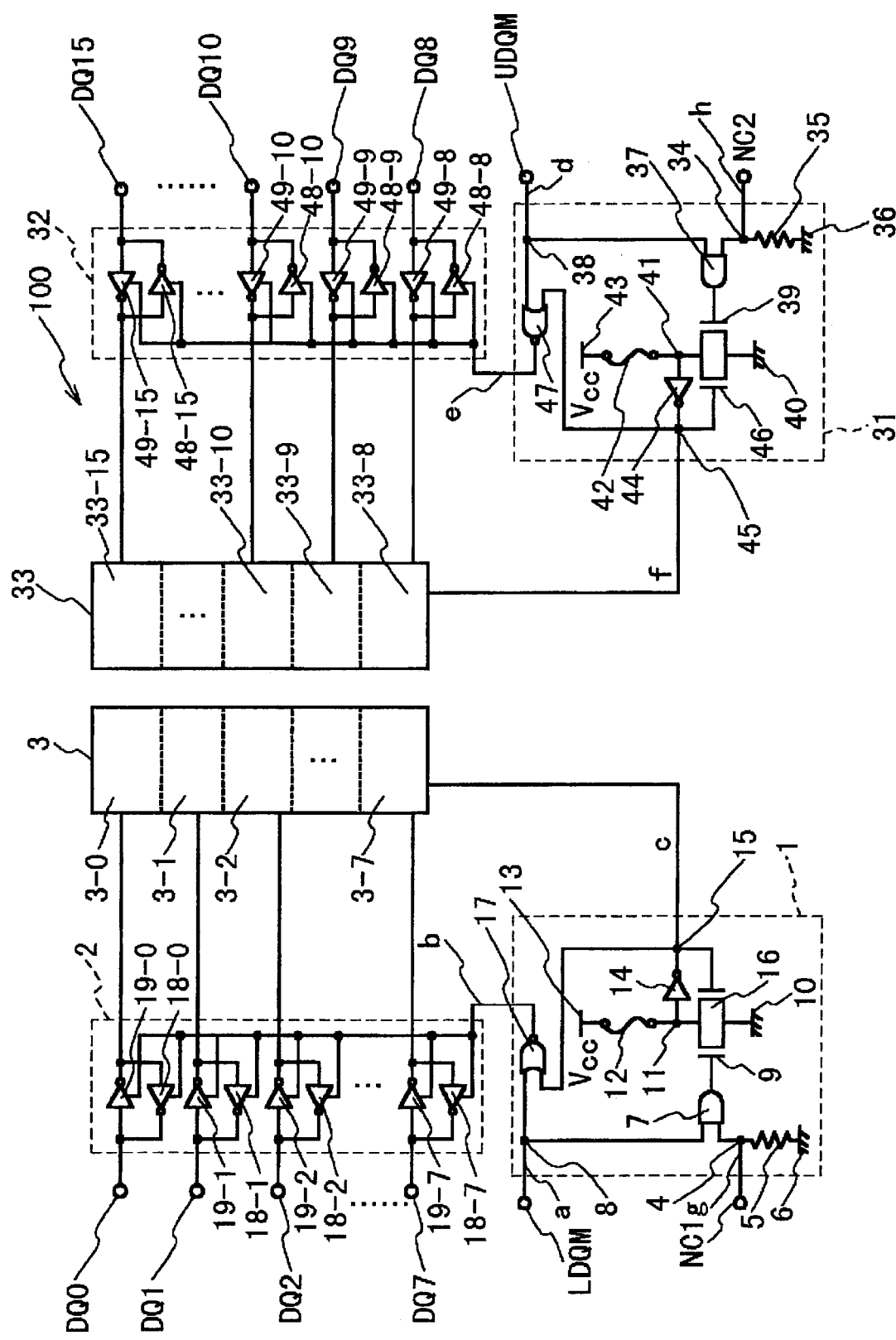
FIG. 1 is a circuit schematic diagram of a semiconductor memory according to an embodiment.

Referring now to FIG. 1, a circuit schematic diagram of a semiconductor memory according to an embodiment is set forth and given the general reference character 100.

Semiconductor memory 100 can include, a shutoff signal generation circuit 1, a switch circuit 2, a memory block 3, terminals (DQ0 to DQ7), and terminal LDQM. Memory block 3 may include memory sub-blocks (3-0 to 3-7). Memory block 3 may be a parallel memory containing eight memory sub-blocks (3-0 to 3-7).

In FIG. 1, terminals (DQ3 to DQ6) and memory sub-blocks (3-3 to 3-6) are not illustrated to avoid unduly cluttering the figure. Also, sections of switch circuit 2 corresponding to terminals (DQ3 to DQ6) are not illustrated.

Shutoff signal generation circuit 1 may include a fuse 12. Fuse 12 may be blown by the application of a current. If at least one memory sub-block (3-0 to 3-7) is defective, fuse 12 may be blown (open). However, if none of the memory sub-blocks (3-0 to 3-7) is defective, fuse 12 may not be blown.

Shutoff signal generation circuit 1 may be connected to terminal LDQM. A mask signal a may be input from terminal LDQM. Shutoff signal generation circuit 1 may generate a shutoff signal b. Shutoff signal b may be received by switch circuit 2.

Switch circuit 2 may respond to shutoff signal b by connecting or disconnecting memory sub-blocks (3-0 to 3-7) of memory block 3 from terminals (DQ0 to DQ7), respectively. When switch circuit 2 connects memory block 3 to terminals (DQ0 to DQ7), memory block 3 may receive external signals through terminals (DQ0 to DQ7) and may operate as a parallel memory having eight input/output terminals.

Shutoff signal generation circuit 1 may generate a memory stop signal c in response to a state of fuse 12 and may output the memory stop signal c to memory block 3. Memory block 3 may operate or stop operation as a memory in response to memory stop signal c.

Semiconductor memory 100 may also include a shutoff signal generation circuit 31, a switch circuit 32, a memory block 33, terminals (DQ8 to DQ15), and terminal UDQM. Memory block 33 may include memory sub-blocks (33-8 to 33-15). Memory block 33 may be a parallel memory containing eight memory sub-blocks (33-8 to 33-15).

In FIG. 1, terminals (DQ11 to DQ14) and memory sub-blocks (33-11 to 33-14) are not illustrated to avoid unduly cluttering the figure. Also, sections of switch circuit 32 corresponding to terminals (DQ11 to DQ14) are not illustrated.

Shutoff signal generation circuit 31 may include a fuse 42. Fuse 42 may be blown by the application of a current. If at least one memory sub-block (33-8 to 33-15) is defective, fuse 42 may be blown (open). However, if none of the memory sub-blocks (33-8 to 33-15) is defective, fuse 42 may not be blown.

Shutoff signal generation circuit 31 may be connected to terminal UDQM. A mask signal d may be input from terminal UDQM. Shutoff signal generation circuit 31 may generate a shutoff signal e. Shutoff signal e may be received by switch circuit 32.

Switch circuit 32 may respond to shutoff signal e by connecting or disconnecting memory sub-blocks (33-8 to 33-15) of memory block 33 from terminals (DQ8 to DQ15), respectively. When switch circuit 32 connects memory block 33 to terminals (DQ8 to DQ15), memory block 33 may receive external signals through terminals (DQ8 to DQ15) and may operate as a parallel memory having eight input/output terminals.

Shutoff signal generation circuit 31 may generate a memory stop signal f in response to a state of fuse 42 and may output the memory stop signal f to memory block 33. Memory block 33 may operate or stop operation as a memory in response to memory stop signal f.

Each section of semiconductor memory 100 will now be explained.

The structure of shutoff signal generation circuit 1 will now be described. Shutoff signal generation circuit 1 may include a resistor 5, ground terminals (6 and 10), AND gate 7, transistors (9 and 16), fuse 12, power terminal 13, inverter 14 and NOR gate 17.

Shutoff signal generation circuit 1 may be connected to a terminal NC1. Terminal NC1 may be connected to one terminal of resistor 5 through a node 4 of shutoff signal generation circuit 1. The other terminal of resistor 5 may be connected to ground terminal 6. Ground terminal 6 may be fixed at the ground potential VSS.

Shutoff signal generation circuit 1 may be connected to terminal LDQM. Terminal LDQM may be connected to one input terminal of AND gate 7 through a node 8. Node 4 may be connected to another input terminal of AND gate 7. An output terminal of AND gate 7 may be connected to gate terminal of transistor 9. A source terminal of transistor 9 may be connected to ground terminal 10. Ground terminal 10 may be fixed at the ground potential VSS.

The drain of transistor 9 may be connected to one terminal of fuse 12 through node 11. The other terminal of fuse 12 may be connected to power terminal 13. Power terminal 13 may be fixed at the power supply potential Vcc.

Node 11 may be connected to the input terminal of inverter 14. Inverter 14 may output a memory stop signal c to memory block 3 through a node 15. Node 11 may also be connected to a drain of transistor 16. The source of transistor 16 may be connected to ground terminal 10. The gate of transistor 16 may be connected to node 15.

Transistors (9 and 16) may be n-type insulated gate field effect transistors (IGFETs), as just one example. Inverter 14 and transistor 16 may operate as a latch to latch a blown fuse logic state at node 11.

Shutoff signal generation circuit 1 may include NOR gate 17. Input terminals of NOR gate 17 may be connected to node 8 and node 15, respectively. NOR gate 17 may output shutoff signal b from an output terminal. Shutoff signal b may be input to switch circuit 2.

The structure of switch circuit 2 will now be described. Switch circuit 2 may include tri-state buffers (18-0 to 18-7), and tri-state buffers (19-0 to 19-7). Input terminals of tri-state buffers (18-0 to 18-7) may be connected, respectively, to memory sub-blocks (3-0 to 3-7) of memory block 3.

Shutoff signal b may be input to tri-state buffers (18-0 to 18-7) and tri-state buffers (19-0 to 19-7). When shutoff signal b is at a high logic level, tri-state buffers (18-0 to 18-7) and tri-state buffers (19-0 to 19-7) may connect memory sub-blocks (3-0 to 3-7) and terminals (DQ0 to DQ7), respectively. When shutoff signal b is at a low logic level, tri-state buffers (18-0 to 18-7) and tri-state buffers (19-0 to 19-7) may electrically disconnect memory sub-blocks (3-0 to 3-7) from terminals (DQ0 to DQ7), respectively, so that terminals (DQ0 to DQ7) may be in a high impedance state.

The structure of shutoff signal generation circuit 31 will now be described. The structure of shutoff signal generation circuit 31 may be similar to the structure of shutoff signal generation circuit 1.

Shutoff signal generation circuit 31 may include a resistor 35, ground terminals (36 and 40), AND gate 37 transistors (39 and 46), fuse 42, power terminal 43, inverter 44 and NOR gate 47.

Shutoff signal generation circuit 31 may be connected to a terminal NC2. Terminal NC2 may be connected to one terminal of resistor 35 through a node 34 of shutoff signal generation circuit 31. The other terminal of resistor 35 may be connected to ground terminal 36. Ground terminal 36 may be fixed at the ground potential VSS.

Shutoff signal generation circuit 31 may be connected to terminal UDQM. Terminal UDQM may be connected to one input terminal of AND gate 37 through a node 38. Node 34 may be connected to another input terminal of AND gate 37. An output terminal of AND gate 37 may be connected to gate terminal of transistor 39. A source terminal of transistor 39 may be connected to ground terminal 40. Ground terminal 40 may be fixed at the ground potential VSS.

The drain of transistor 39 may be connected to one terminal of fuse 42 through node 41. The other terminal of fuse 42 may be connected to power terminal 43. Power terminal 43 may be fixed at the power supply potential Vcc.

Node 41 may be connected to the input terminal of inverter 44. Inverter 44 may output a memory stop signal f to memory block 33 through a node 45. Node 41 may also be connected to a drain of transistor 46. The source of transistor 46 may be connected to ground terminal 40. The gate of transistor 46 may be connected to node 45.

Transistors (39 and 46) may be n-type insulated gate field effect transistors (IGFETs), as just one example.

Shutoff signal generation circuit 31 may include NOR gate 47. Input terminals of NOR gate 47 may be connected to node 38 and node 45, respectively. NOR gate 47 may output shutoff signal e from an output terminal. Shutoff signal e may be input to switch circuit 32.

The structure of switch circuit 32 will now be described. Switch circuit 32 may include tri-state buffers (48-8 to 48-15), and tri-state buffers (49-8 to 49-15). Input terminals of tri-state buffers (48-8 to 48-15) may be connected, respectively, to memory sub-blocks (33-8 to 33-15) of memory block 33.

Shutoff signal e may be input to tri-state buffers (48-8 to 48-5) and tri-state buffers (49-8 to 49-15). When shutoff signal e is at a high logic level, tri-state buffers (48-8 to 48-15) and tri-state buffers (49-8 to 49-15) may connect memory sub-blocks (33-8 to 33-15) and terminals (DQ8 to DQ15), respectively. When shutoff signal e is at a low logic level, tri-state buffers (48-8 to 48-15) and tri-state buffers (49-8 to 49-15) may electrically disconnect memory sub-blocks (33-0 to 33-7) from terminals (DQ8 to DQ15), respectively, so that terminals (DQ8 to DQ15) may be in a high impedance state.

The operation of the semiconductor memory 100 will now be explained.

When neither memory block 3 nor second block 33 may be defective, semiconductor memory 100 may be used as a parallel memory having sixteen input/output terminals (DQ0 to DQ15). However, when either memory block 3 or memory block 33 may be defective, semiconductor memory 100 may be used as a parallel memory having either input/output terminals (DQ0 to DQ7 or DQ8 to DQ15).

In this way, when either one of memory block 3 or memory block 33 is defective, semiconductor memory 100 may be used as a parallel memory having half the capacity of a non-defective parallel memory in either memory blocks (3 and 33).

Semiconductor memory 100 may determine whether to blow fuses (12 and 42), respectively, depending on whether memory block 3 of memory block 33 is defective. Depending on whether fuse 12 or fuse 42 is blown, semiconductor memory may function as a parallel memory having sixteen I/O terminals (DQ0 to DQ15) or as a parallel memory having eight I/O terminals (DQ0 to DQ7 or DQ8 to DQ15).

When memory block 3 is defective, fuse 12 may be blown. When fuse 12 is blown, shutoff signal generation circuit 1 may provide a shutoff signal b having a logic low level to switch circuit 2 regardless of the state of mask signal a. In response to the logic low level of shutoff signal b, switch circuit 2 may disconnect terminals (DQ0 to DQ7) from memory block 3. This may place terminals (DQ0 to DQ7) in a high impedance state.

When fuse 12 is blown, semiconductor memory 100 may operate as a parallel memory having eight I/O terminals (DQ8 to DQ15). In this way, if semiconductor memory 100 is defective in memory block 3, it may be used as a parallel memory having eight I/O terminals (DQ8 to DQ15).

When fuse 12 is blown, shutoff signal generation circuit 1 may set the memory stop signal c to a high logic level. The high logic level may be output to memory block 3. Memory block 3 may detect that memory stop signal c is at a high logic level and may stop operation. In this way, semiconductor memory 100 may reduce power consumption because it may be used as a parallel memory having eight I/O terminals (DQ8 to DQ15).

Similarly, when memory block 33 is defective, fuse 42 may be blown. When fuse 42 is blown, shutoff signal generation circuit 31 may provide a shutoff signal e having a logic low level to switch circuit 32 regardless of the state of mask signal d. In response to the logic low level of shutoff signal e, switch circuit 32 may disconnect terminals (DQ8 to DQ15) from memory block 33. This may place terminals (DQ8 to DQ15) in a high impedance state.

When fuse 42 is blown, semiconductor memory 100 may operate as a parallel memory having eight I/O terminals (DQ0 to DQ7). In this way, if semiconductor memory 100 is defective in memory block 33, it may be used as a parallel memory having eight I/O terminals (DQ0 to DQ7).

When fuse 42 is blown, shutoff signal generation circuit 31 may set the memory stop signal f to a high logic level. The high logic level may be output to memory block 33. Memory block 33 may detect that memory stop signal f is at a high logic level and may stop operation. In this way, semiconductor memory 100 may reduce power consumption because it may be used as a parallel memory having eight I/O terminals (DQ0 to DQ7).

On the other hand, when neither memory block 3 nor memory block 33 has defects, semiconductor memory 100 may be used without blowing fuse 12 or fuse 42.

When fuse 12 is intact, mask signal generation circuit 1 may output a shutoff signal b having either a high or low logic level, in response to mask signal a. Switch circuit 2 may connect or disconnect memory block 3 from terminals (DQ0 to DQ7) in response to shutoff signal b.

When fuse 12 is intact and mask signal a is input having a low logic level, mask signal generation circuit 1 may output a shutoff signal b having a high logic level potential. At this time, in response to the high logic level of the shutoff signal b, switch circuit 2 may connect memory block 3 to terminals (DQ0 to DQ7).

When fuse 12 is intact and mask signal a is input having a high logic level, mask signal generation circuit 1 may output a shutoff signal b having a low logic level potential. At this time, in response to the low logic level of the shutoff signal b, switch circuit 2 may electrically disconnect memory block 3 from terminals (DQ0 to DQ7).

Accordingly, when fuse 12 is connected, memory block 3 may operate as a parallel memory to transfer signals through terminals (DQ0 to DQ7) in response to mask signal a.

Similarly, when fuse 42 is connected, memory block 33 may operate as a parallel memory to transfer signals through terminals (DQ8 to DQ15) in response to mask signal d.

As described above, when neither fuse 12 nor fuse 42 is blown, semiconductor memory 100 may operate as a parallel memory having sixteen terminals (DQ0 to DQ15). In this case, signals may be processed through memory block 3 and memory block 33 in response to mask signal a or mask signal d, respectively.

It should be noted that shutoff signal generation circuit 1 may not generate memory stop signals c in this embodiment. In such a case, memory block 3 may not stop its operation even when fuse 12 is blown. Similarly, shutoff signal generation circuit 31 may not generate stop signal f. In such a case, memory block 33 may not stop its operation even when fuse 42 is blown. In this arrangement, the power consumption of semiconductor memory 100 may increase, but the circuit configuration may become simpler.

It may also be possible to provide an arrangement so that when memory block 3 is not defective, fuse 12 may be blown. Likewise, when memory block 3 is defective, fuse 12 may not be blown. In such a case, the configuration of shutoff signal generation circuit 1 may be changed accordingly.

Similarly, it may be possible to provide an arrangement so that when memory block 33 is not defective, fuse 42 may be blown. Likewise, when memory block 33 is defective, fuse 42 may not be blown. In such a case, the configuration of shutoff signal generation circuit 31 may be changed accordingly.

Blowing fuses (12 and 42) may be expensive in terms of time and cost. Also, memory blocks (3 and 33) may not often be plagued by defects. Therefore, the approach of blowing fuses (12 and 42) when memory blocks (3 and 33) are defective may result in a smaller number of fuse blowing events. Thus, this type of arrangement may be preferable from the viewpoint of saving time and reducing cost.

Semiconductor memory 100 in this embodiment may be used after it is inspected for defects according to a method of inspection to be described. Fuses (12 or 42) in semiconductor memory 100 may be blown depending on the results of such an inspection process. The inspection method will now be discussed with reference to FIGS. 1, 2 and 3.

Figure 2:
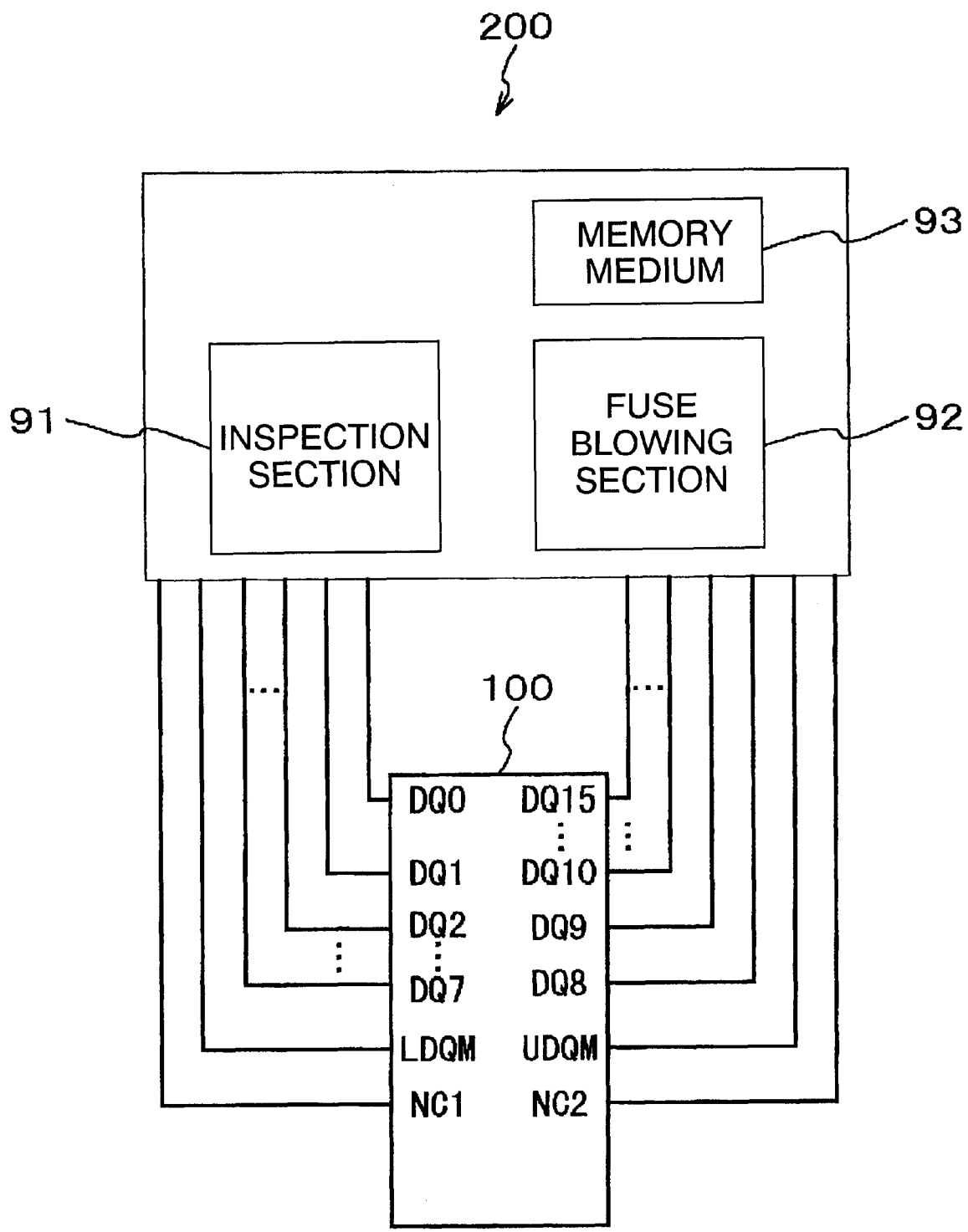
FIG. 2 is a block schematic diagram of a memory inspection apparatus according to an embodiment.

Referring now to FIG. 2, a block schematic diagram of a memory inspection apparatus according to an embodiment is set forth and given the general reference character 200.

Memory inspection apparatus 200 may include an inspection section 91, a fuse blowing section 92, and a memory device 93. Memory inspection apparatus 200 may inspect a semiconductor memory 100 as described in the embodiment of FIG. 1, as just one example.

Figure 3:
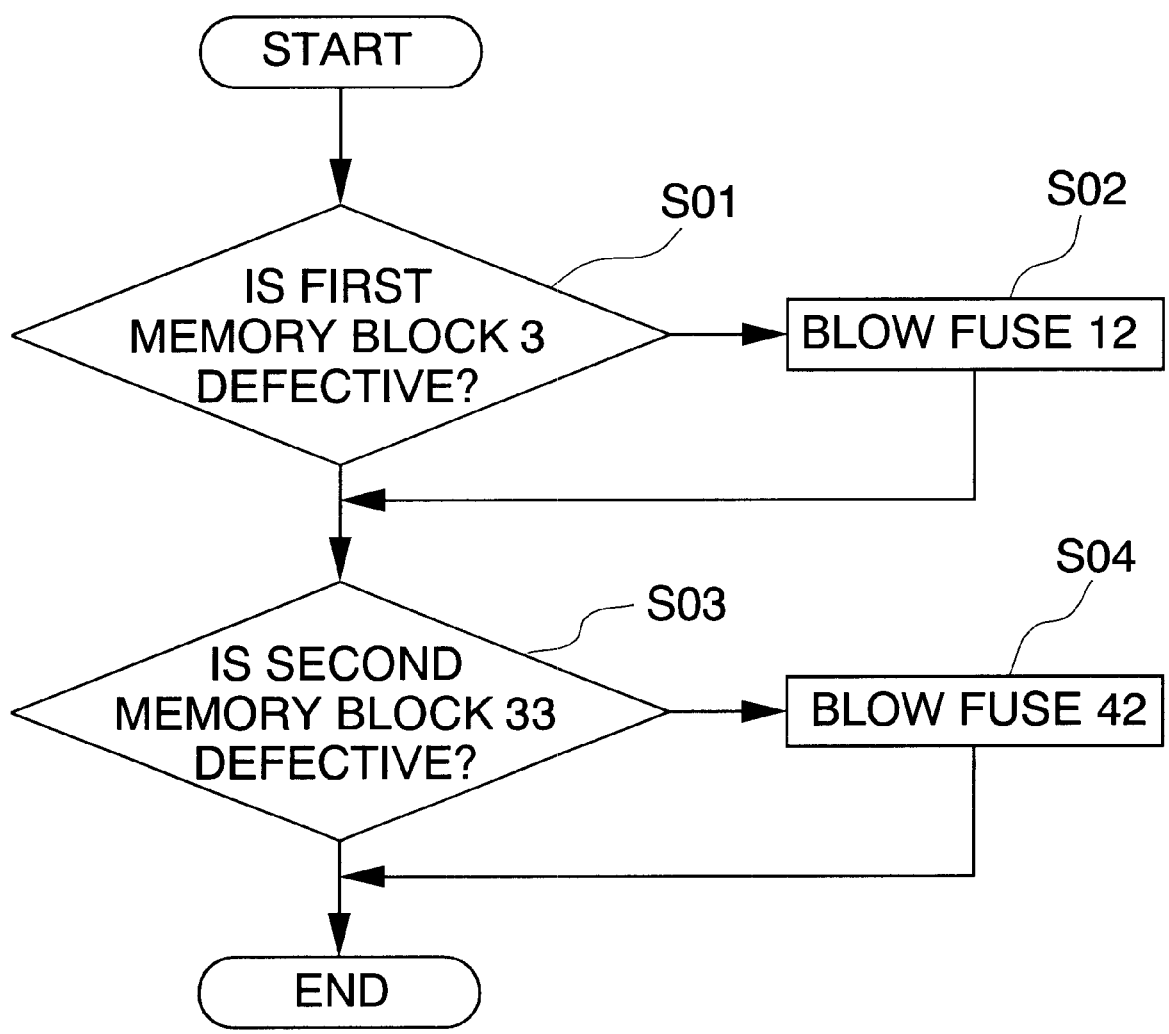
FIG. 3 is a flowchart illustrating the process of inspection of the semiconductor memory according to an embodiment.

Referring now to FIG. 3, a flowchart illustrating the process of inspection of the semiconductor memory according to an embodiment is set forth.

The inspection process will be explained by dividing the entire inspection process into discrete steps (S01 to S04).

Step S01:

Memory block 3 may be inspected by inspection section 91. When memory block 3 is defective, step S02 may be executed. When memory block 3 is not defective, step S02 may not be executed and step S03 may be executed.

Step S02:

Referring now to FIG. 1, fuse 12 may be blown by fuse blowing section 92. Fuse blowing section 92 may input a masking signal a, having a high logic level, from terminal LDQM and a fuse blowing signal g, having a high logic level, from terminal NC1 into semiconductor memory 100. By so doing, the gate of transistor 9 may receive a high logic level and may become conductive. When transistor 9 is conductive, current may flow through fuse 12 from power terminal 13 to ground terminal 10. As a result of current flowing through fuse 12, the fuse 12 may be blown.

When fuse 12 is blown, switch circuit 2 may electrically disconnect terminals (DQ0 to DQ7) from first memory block 3. In this way, terminals (DQ0 to DQ7) may be in an open state with respect to external input signals. Following step S02, step S03 may be executed.

Step S03:

Memory block 33 may be inspected by inspection section 91. When memory block 33 is defective, step S04 may be executed. When memory block 33 is not defective, the inspection process of semiconductor memory 100 may be completed.

Step S04:

Referring now to FIG. 1, fuse 42 may be blown by fuse blowing section 92. Fuse blowing section 92 may input a masking signal d, having a high logic level, from terminal UDQM and a fuse blowing signal h, having a high logic level, from terminal NC2 into semiconductor memory 100. By so doing, the gate of transistor 39 may receive a high logic level and may become conductive. When transistor 39 is conductive, current may flow through fuse 42 from power terminal 43 to ground terminal 40. As a result of current flowing through fuse 42, the fuse 42 may be blown.

When fuse 42 is blown, switch circuit 32 may electrically disconnect terminals (DQ8 to DQ15) from first memory block 33. In this way, terminals (DQ8 to DQ15) may be in an open state with respect to external input signals. Following step S04, the inspection process of semiconductor memory 100 may be completed.

Steps (S01 to S04) may be executed according to an application program stored in memory device 93. The application program may be installed in the memory device 93 from a recorded medium that stores the application program.

The inspection method of semiconductor memory 100 described above can be performed after semiconductor memory 100 has been packaged. It may also be performed after semiconductor memory 100 has been mounted on a circuit board. This is possible because fuse (12 or 42) may be blown electrically by inputting masking signal a and fuse blowing signal g via terminals (LDQM and NC1), respectively, or by inputting masking signal d and fuse blowing signal h via terminals (UDQM and NC2) respectively.

Next a memory-mounted circuit board according to an embodiment will be explained in which semiconductor memory 100 may be mounted on a circuit board.

Two types of circuit boards may be used for installing semiconductor memory 100, depending on whether fuses (12 or 42) are blown. If neither fuse 12 nor fuse 42 in semiconductor memory 100 is blown, it may be referred to as semiconductor memory 100a in the following illustrations. If one of fuses (12 or 42) in semiconductor memory 100 is blown, it may be referred to as semiconductor memory 100b in following illustrations.

Figure 4:
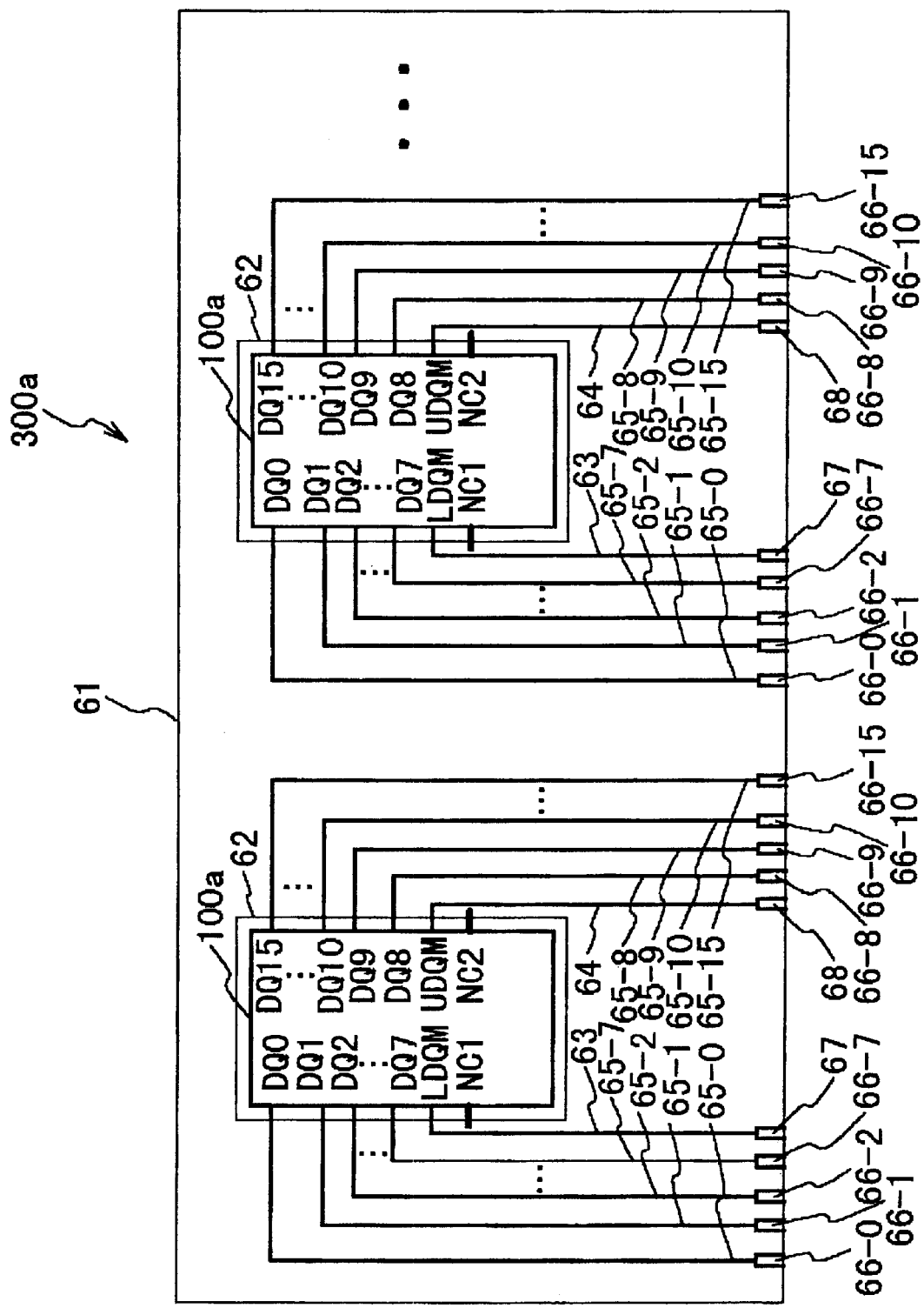
FIG. 4 is a block diagram of a circuit board according to an embodiment.

Referring now to FIG. 4, a block diagram of a circuit board according to an embodiment is set forth and given the general reference character 300a.

Circuit board 300a may include semiconductor memory 100a in which fuses (12 and 42) may not be blown. Circuit board 300a may include a substrate base 61. Substrate base 61 may be provided with a mounting section 62 where semiconductor memory 100a may be mounted. Neither fuse 12 nor fuse 42 in the semiconductor memory 100a may be blown.

Wirings (63, 64, and 65-0 to 65-15) may be provided on substrate base 61. Wiring 63 may be connected to terminal LDQM of semiconductor memory 100a. Wiring 64 may be connected to terminal UDQM of semiconductor memory 100a. Wirings (65-0 to 65-15), may be connected, respectively to terminals (DQ0 to DQ15) of semiconductor memory 100a.

Circuit board 300a may be provided with board terminals (66-0 to 66-15, 67, and 68). Board terminals (66-0 to 66-15, 67, and 68) may be connected, respectively, to wirings (65-0 to 65-15, 63 and 64).

Board terminals (66-0 to 66-15) may be connected, respectively to terminals (DQ0 to DQ15) of semiconductor memory 100a. Therefore, semiconductor memory 100a mounted on circuit board 300a may receive or output signals at terminals (DQ0 to DQ15) through board terminals (66-0 to 66-15). Semiconductor memory 100a mounted on circuit board 300a may operate as a parallel memory having sixteen I/O terminals that may transfer data signals through board terminals (66-0 to 66-15).

Figure 5:
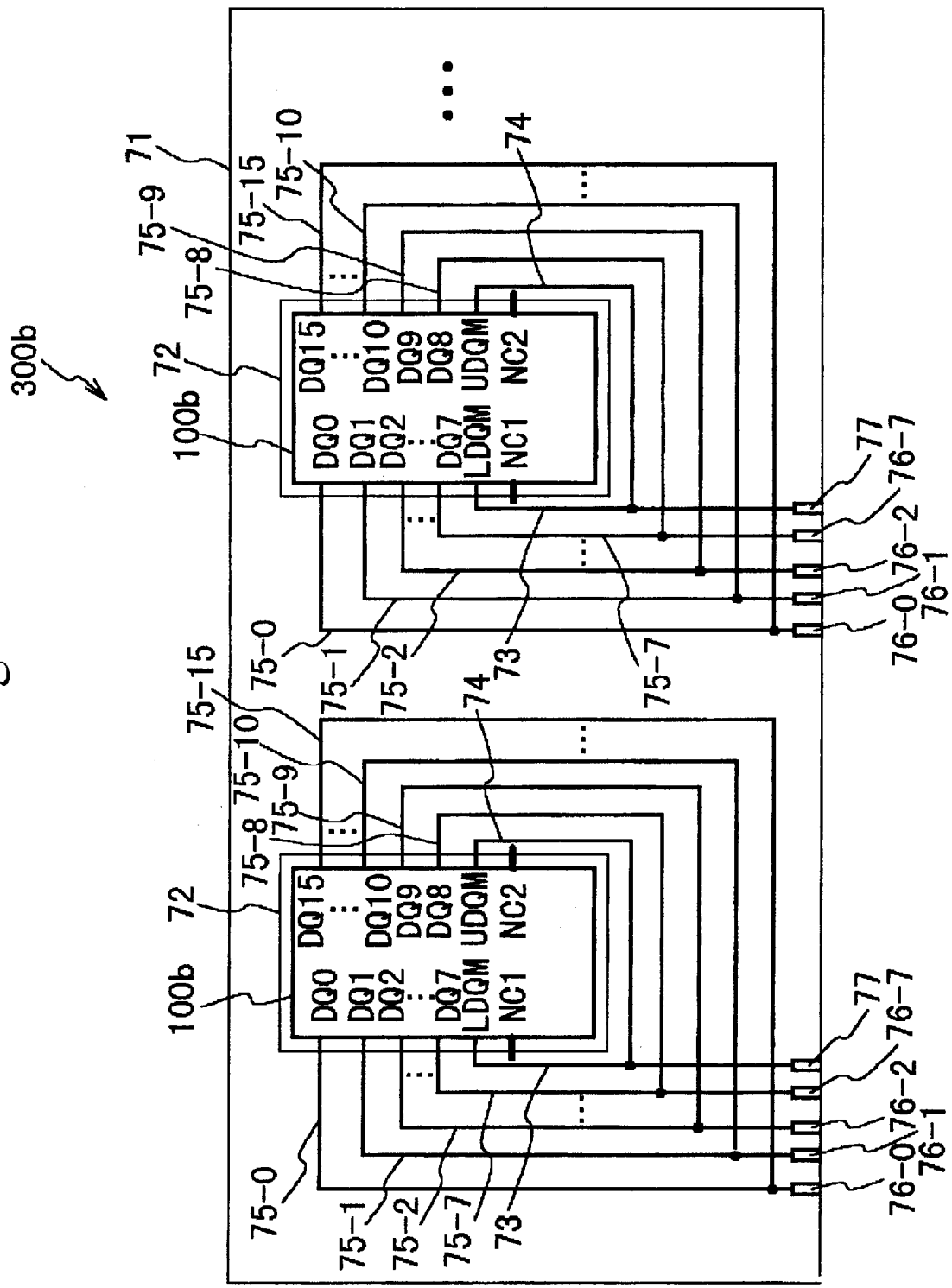
FIG. 5 is a block diagram of a circuit board according to an embodiment.

Referring now to FIG. 5, a block diagram of a circuit board according to an embodiment is set forth and given the general reference character 300b.

Circuit board 300b may include semiconductor memory 100b in which fuses (12 and 42) may be blown. Circuit board 300b may include a substrate base 71. Substrate base 71 may be provided with a mounting section 72 where semiconductor memory 100b may be mounted. Fuse 12 or fuse 42 in the semiconductor memory 100b may be blown.

Wirings (73, 74, and 75-0 to 75-15) may be provided on substrate base 71. Wiring 73 may be connected to terminal LDQM of semiconductor memory 100b. Wiring 74 may be connected to terminal UDQM of semiconductor memory 100b. Wirings (75-0 to 75-15), may be connected, respectively to terminals (DQ0 to DQ15) of semiconductor memory 100b.

Wiring 75-0 may be shorted to wiring 75-15. Wiring 75-1 may be shorted to wiring 75-14. Similarly, any wiring 75-i may be shored with wiring 75-(15-i), where i is an integer between 0 and 7.

Circuit board 300b may be provided with board terminals (76-0 to 76-7). Board terminals (76-0 to 76-7) may be connected, respectively, to wirings (75-0 to 75-7).

When fuse 12 on semiconductor memory 100b is blown, semiconductor memory 100b may operate as a memory device having memory block 33 only. In this case, memory block 33 may transfer signals via terminals (DQ8 to DQ15).

Terminals (DQ8 to DQ15) may be connected to board terminals (76-0 to 76-7) via the respective wiring (75-8 to 75-15). Therefore, when fuse 12 is blown, semiconductor memory 100b mounted on circuit board 300b may transfer signals to and from memory block 33 via board terminals (76-0 to 76-7).

On the other hand, when fuse 42 of semiconductor memory 100b is blown, semiconductor memory 100b may operate as a memory having memory block 3 only. In this case, memory block 3 may transfer signals via terminals (DQ0 to DQ7).

Terminals (DQ0 to DQ7) may be connected to board terminals (76-0 to 76-7) through the respective wiring (75-0 to 75-7). Therefore, when fuse 42 is blown, semiconductor memory 100b mounted on memory board 300b may transfer signals to and from memory block 3 through board terminals (76-0 to 76-7).

That is when fuse 42 of semiconductor memory 100b is blown, semiconductor memory 100b mounted on circuit board 300b may operate as a parallel memory having eight I/O terminals capable of transferring signals via board terminals (76-0 to 76-7).

Accordingly, semiconductor memory 100b mounted on circuit board 300b may operate as a parallel memory having eight I/O terminals receiving signal from board terminals (76-0 to 76-7), even when one of fuses (12 or 42) is defective.

Semiconductor memory 100b mounted on circuit board 300b may be capable of operating as a parallel memory having half the capacity of semiconductor memory 100a mounted on board 300a.

Figure 6:
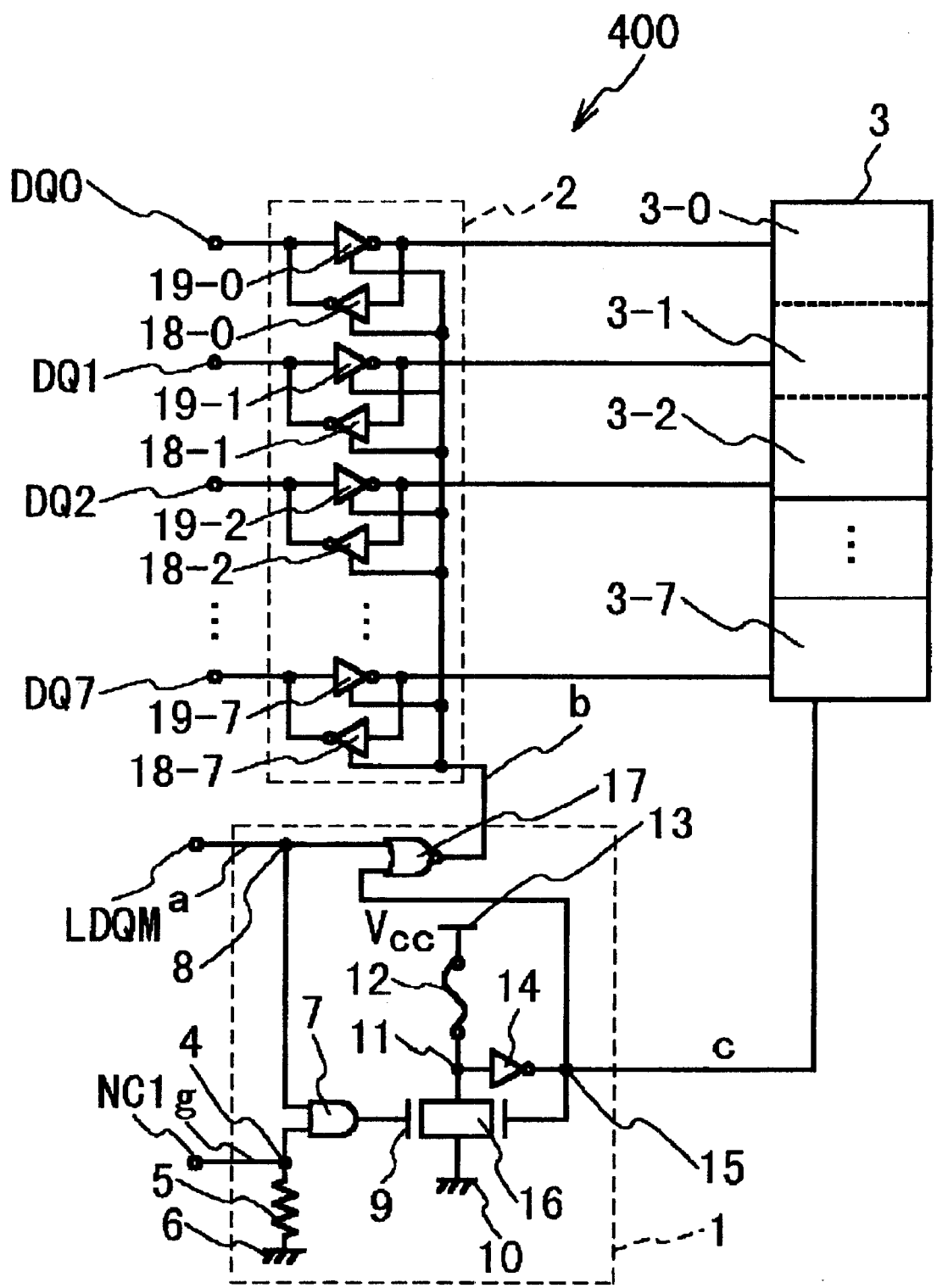
FIG. 6 is a circuit schematic diagram of a semiconductor memory according to an embodiment.

Referring now to FIG. 6, a circuit schematic diagram of a semiconductor memory according to an embodiment is set forth and given the general reference character 400.

Similarly to the semiconductor memory 100 of FIG. 1, semiconductor memory 400 of FIG. 6 can include shutoff signal generation circuit 1, switch circuit 2, memory block 3, terminals (DQ0 to DQ7), and terminal LDQM. Memory block 3 may include memory sub-blocks (3-0 to 3-7). Memory block 3 may be a parallel memory containing eight memory sub-blocks (3-0 to 3-7).

In FIG. 6, terminals (DQ3 to DQ6) and memory sub-blocks (3-3 to 3-6) are not illustrated to avoid unduly cluttering the figure. Also, sections of switch circuit 2 corresponding to terminals (DQ3 to DQ6) are not illustrated.

However, unlike the semiconductor memory 100 of FIG. 1, semiconductor memory 400 of FIG. 6 may not include shutoff signal generation circuit 31, switch circuit 32, and memory block 33.

Memory block 1 may be a non-defective parallel memory having eight I/O terminals (DQ0 to DQ7).

Figure 7:
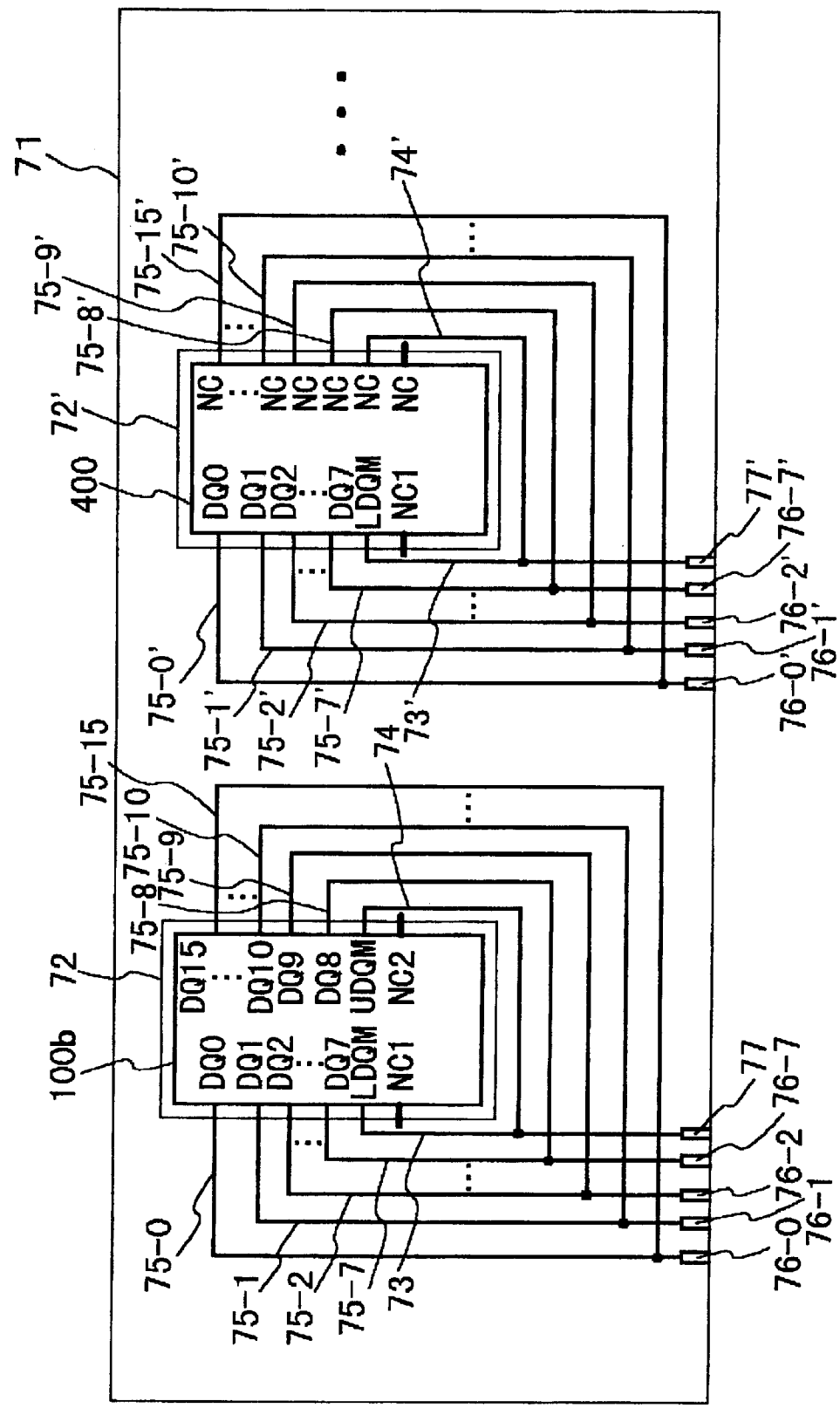
FIG. 7 is a block diagram of a circuit board according to an embodiment.

Referring now to FIG. 7, a block diagram of a circuit board according to an embodiment is set forth and given the general reference character 300b.

Circuit board 300b may include semiconductor memory 400 and semiconductor memory 100b. In this way, circuit board 300b may include semiconductor memory 100b, which may have a fuse (12 or 42) blown and semiconductor memory 400, which may be non-defective.

Circuit board 300b can include mounting sections (72 and 72'). Mounting section 72 as well as wirings from semiconductor memory 100b may be similar to such components on circuit board 300b illustrated in FIG. 6.

Substrate base 71 may be provided with a mounting section 72' where semiconductor memory 400 may be mounted.

Wirings (73', 74', and 75-0' to 75-15') may be provided on substrate base 71. Wiring 73' may be connected to terminal LDQM of semiconductor memory 400. Wirings (75-0' to 75-15'), may be connected, respectively to terminals (DQ0 to DQ15) of semiconductor memory 400.

Wiring 75-0' may be shorted to wiring 75-15'. Wiring 75-1' may be shorted to wiring 75-14'. Similarly, any wiring 75-i' may be shored with wiring 75-(15-i'), where i' is an integer between 0 and 7.

Circuit board 400 may be provided with board terminals (76-0' to 76-7').

Semiconductor memory 400 mounted on mounting section 72' may function as a parallel memory having eight I/O terminals (DQ0 to DQ7).

Accordingly, semiconductor memory 400 may be mounted circuit board 300b having semiconductor memory 100b in which one of fuses (12 or 42) may be blown. Circuit board 300b, illustrated in FIG. 7, may be the same type of circuit board 300b as illustrated in the embodiment of FIG. 5.

Semiconductor memory 400 may have only half the capacity as semiconductor memory 100a. Therefore, the yield of semiconductor memory 400 may be normally higher than that of semiconductor memory 100a. Also, semiconductor memory 400 may have a smaller chip size, thus manufacturing costs may be lower. By combining semiconductor memory 400 with semiconductor memory 100a, semiconductor memory 100b having defects in either memory block 3 or memory block 33 may be effectively used.

Figure 13:
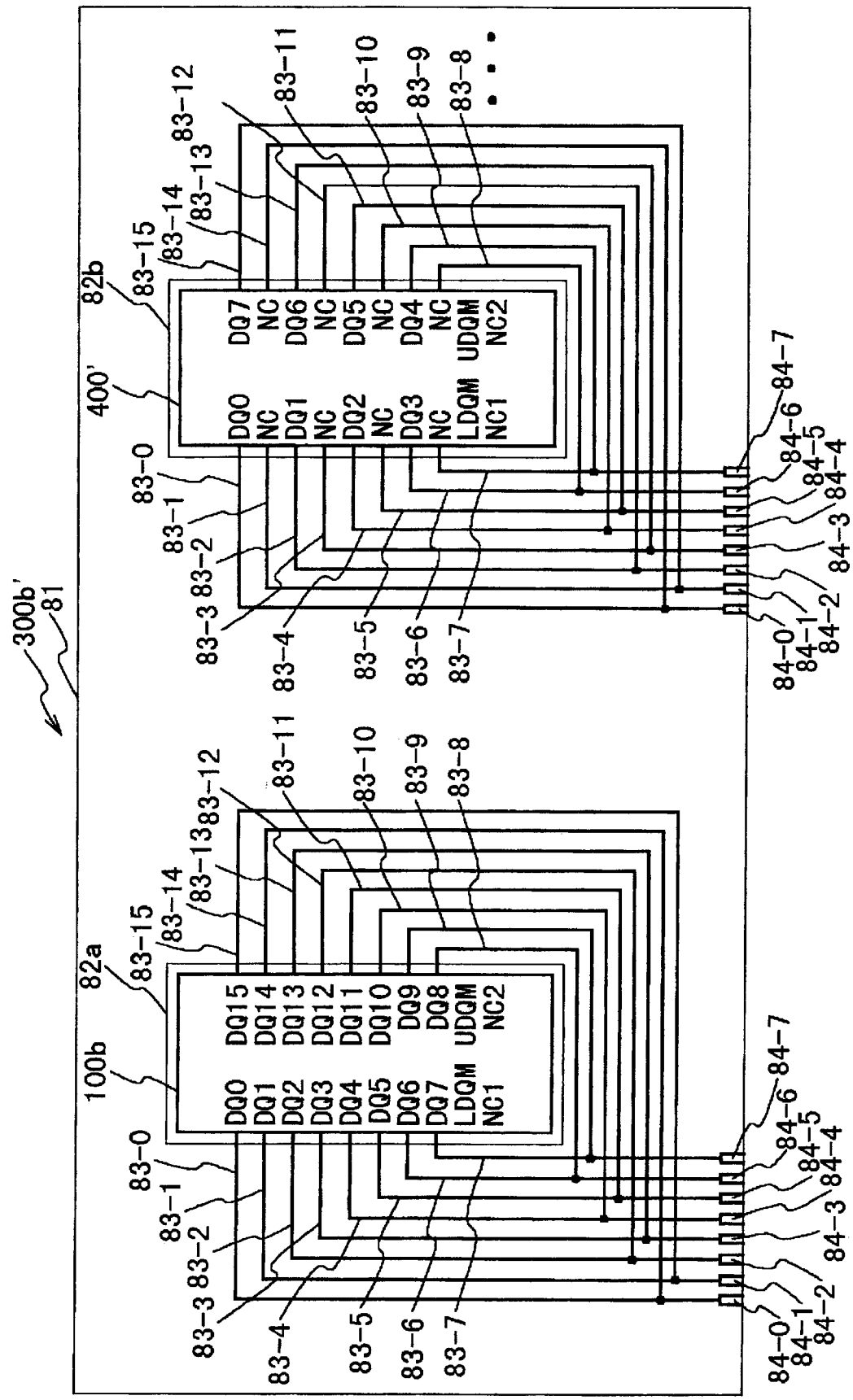
FIG. 13 is a block diagram of a circuit board according to an embodiment.

Referring now to FIG. 13, a block diagram of a circuit board according to an embodiment is set forth and given the general reference character 300b'.

Circuit board 300b' in the embodiment of FIG. 13 may be similar to circuit board 300b of FIG. 7, except a semiconductor memory 400' may be used instead of semiconductor memory 400.

Semiconductor memory 400' may have a different placement of terminals (DQ0 to DQ7) than semiconductor memory 400. Thus, the placing of wirings may be different. Semiconductor memory 400' may be a non-defective parallel memory having eight I/O terminals (DQ0 to DQ7).

Circuit board 300b may include semiconductor memory 100b and semiconductor memory 400'. Semiconductor memory 400' may have the altered terminal arrangment.

Circuit board 300b may be provided with a substrate base 81. Substrate base 81 may include a mounting section 82b and wiring (83-0 to 83-15). Wiring (83-0 to 83-7) may connect to board terminals (84-0 to 84-7).

Each mounting section (82a and 82b) may accommodate either semiconductor memory 100b or semiconductor memory 400'. In the example illustrated in FIG. 13, semiconductor memory 100b may be mounted on mounting section 82a and semiconductor memory 400' may be mounted on mounting section 82b.

Terminals (DQ0 to DQ15) of semiconductor memory 100b may connect to wirings (83-0 to 83-15), respectively. In this case, terminals (DQ8 to DQ15) may also be connected to wiring (83-6, 83-7, 83-4, 83-5, 83-2, 83-3, 83-0, and 83-1), respectively. Terminals (DQ8 to DQ15) of semiconductor memory 100b may then also be electrically connected to board terminals (84-6, 84-7, 84-4, 84-5, 84-2, 84-3, 84-0, and 84-1), respectively.

When fuse 12 of semiconductor memory 100b is blown so that it is used as a parallel memory to transfer signals from terminals (DQ8 to DQ15), signals may be transferred from terminals (DQ8 to DQ15) through board terminals (84-6, 84-7, 84-4, 84-5, 84-2, 84-3, 84-0, and 84-1), respectively.

On the other hand, when fuse 42 of semiconductor memory is blown, so that it is used as a parallel memory to transfer signals from terminals (DQ0 to DQ7), signals may be transferred from terminals (DQ0 to DQ7) through board terminals (84-0 to 84-7), respectively.

Accordingly, when semiconductor memory 100b is mounted on memory board 300b', semiconductor memory 100b may operate as a parallel memory having eight I/O terminals for transferring signals through terminals (DQ0 to DQ7) or terminals (DQ8 to DQ15) even when one of fuses (12 or 42) is blown.

On the other hand, terminals (DQ0 to DQ3) of semiconductor memory 400' may connect to wiring (83-0, 83-2, 83-4, and 83-6), respectively. Terminals (DQ0 to DQ3) of semiconductor memory 400' may connect to board terminals (84-0, 84-2, 84-4, and 84-6), respectively.

Terminal DQ4 of semiconductor memory 400' may connect to board terminal 84-7 through wirings (83-9 and 83-7). Terminal DQ5 of semiconductor memory 400' may connect to board terminal 84-5 through wirings (83-11 and 83-5). Terminal DQ6 of semiconductor memory 400' may connect to board terminal 84-3 through wirings (83-13 and 83-3). Terminal DQ7 of semiconductor memory 400' may connect to board terminal 84-1 through wirings (83-15 and 83-1).

Accordingly, when semiconductor memory 400' is mounted on circuit board 300b', terminals (DQ0 to DQ7) of semiconductor memory 400' may connect to board terminals (84-0, 84-2, 84-4, 84-6, 84-7, 84-5, 84-3, and 84-1), respectively. In this way, semiconductor memory 400' may operate as a parallel memory having eight I/O terminals for transferring signals through board terminals (84-0 to 84-7).

As explained above, semiconductor memory 400' in this embodiment (FIG. 13) may be mounted on the same type of circuit board as circuit board 300b' as illustrated in the embodiment of FIG. 7 in which one of fuses (12 or 42) may be blown.

By combining semiconductor memory 400' and semiconductor memory 100b, it may be possible to use semiconductor memory 100b that is defective in either memory block 3 or memory block 33 more effectively.

Figure 8:
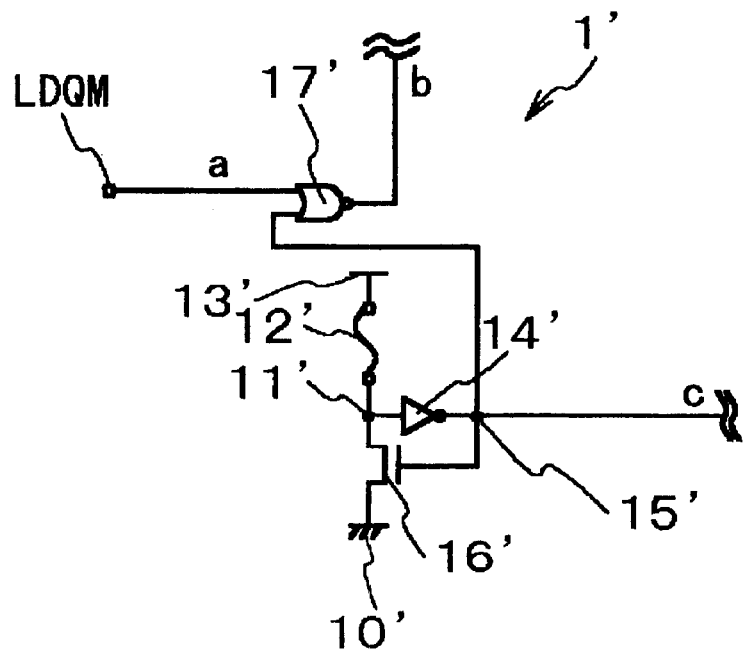
FIG. 8 is a circuit diagram of a shutoff signal generation circuit according to an embodiment.

Referring now to FIG. 8, a circuit diagram of a shutoff signal generation circuit according to an embodiment is set forth and given the general reference character 1'.

Shutoff signal generation circuit 1' may be used to replace shutoff signal generation circuit 1 illustrated in earlier embodiments.

Shutoff signal generation circuit 1' may include a power terminal 13' which may be fixed at a source power potential. Power terminal 13' may connect to one terminal of fuse 12'. Fuse 12' may be a fuse that may be trimmed by a laser trimmer. The other end of fuse 12' may connect to a node 11'. Node 11' may connect to an input terminal of an inverter 14'.

An output terminal of inverter 14' may connect to a node 15'. Inverter 14' may output a memory stop signal c though a node 15'. Node 15' may connect to a gate terminal of a transistor 16'. A drain terminal of transistor 16' may connect to node 11'. A source terminal of transistor 16' may connect to a ground terminal 10'. Ground terminal 10' may be fixed at a ground potential.

Node 15' may connect to one input terminal of a NOR gate 17'. Another input terminal of NOR gate 17' may be connected to terminal LDQM. NOR gate 17' may output a shutoff signal b.

Fuse 12' may be blown by a laser trimmer radiating a laser beam on the fuse 12'. Otherwise, the operation of shutoff signal generation circuit 1' may be similar to the operation of shutoff signal generation circuit 1 discussed earlier.

The structure of shutoff signal generation circuit 1' may be simpler than that of shutoff signal generation circuit 1.

Also, shutoff signal generation circuit 1' may be used to replace shutoff signal generation circuit 31 illustrated in earlier embodiments. In this case, inverter 14' may output a memory stop signal f instead of a memory stop signal c. Also, the input terminal of NOR gate 17' may connect to terminal UDQM instead of terminal LDQM. Also, NOR gate 17' may output shutoff signal e instead of shutoff signal b.

Figure 9:
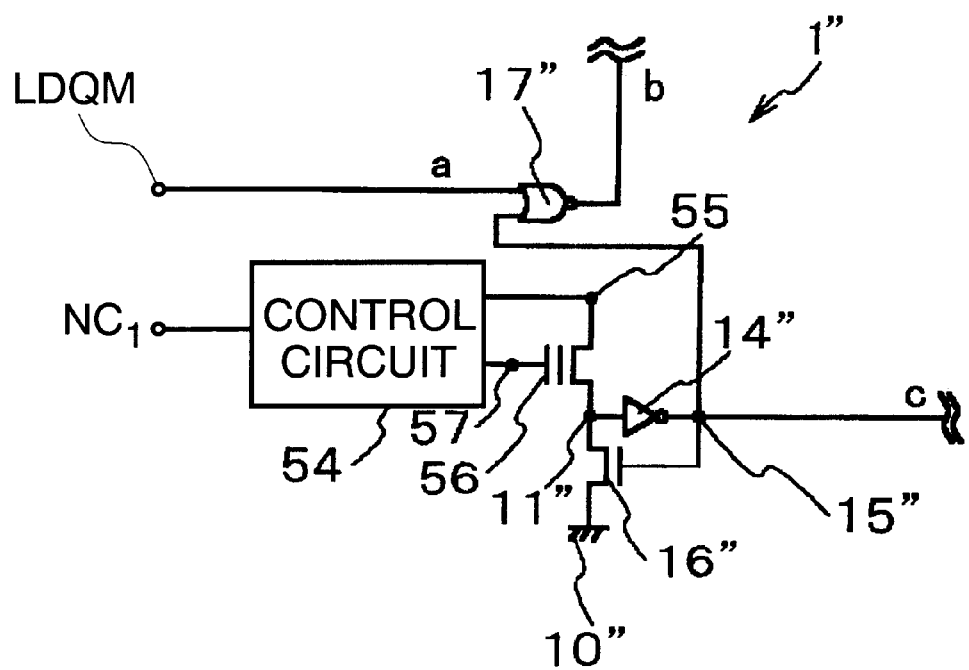
FIG. 9 is a circuit schematic diagram illustrating operating conditions of a reference configuration circuit during the normal operation in the LVTTL mode according to an embodiment.

Referring now to FIG. 9, a circuit schematic diagram of a shutoff signal generation circuit according to an embodiment is set forth and given the general reference character 1".

Shutoff signal generation circuit 1" may be used to replace shutoff signal generation circuit 1 illustrated in earlier embodiments.

Shutoff signal generation circuit 1" may include a control circuit 54. Control circuit 54 may connect to terminal NC1. Control circuit 54 may connect to a node 55, which may connect to a drain terminal of a one-transistor type (1 Tr-type) high dielectric non-volatile memory 56.

Control circuit 54 may also connect to a node 57. Node 57 may connect to a control gate of 1 Tr-type high dielectric non-volatile memory 56. A source terminal of 1 Tr-type high dielectric non-volatile memory 56 may connect to a node 11". Node 11" may connect to an input terminal of an inverter 14". An output terminal of inverter 14" may connect to a node 15". Inverter 14" may output a memory stop signal c through node 15". Node 15" may connect to a gate terminal of a transistor 16". A drain terminal of transistor 16" may connect to node 11". A source terminal of transistor 16" may connect to a ground terminal 10". Ground terminal 10" may be fixed at a ground potential.

Node 15" may connect to an input terminal of NOR gate 17". Another input terminal of NOR gate 17" may connect to terminal LDQM. NOR gate 17" may output a shutoff signal b.

The operation of a semiconductor memory in which signal generation circuit 1 is replaced with shutoff signal generation circuit 1" will now be explained.

In this case, instead of blowing fuse 12, data may be written into 1 Tr-type high dielectric non-volatile memory 56.

In this example, it is supposed that, in step S01 of the inspection process (FIG. 3), memory block 3 may be inspected and found to be defective. In this case, in step S02 (FIG. 3), instead of blowing fuse 12, 1 Tr-type high dielectric non-volatile memory 56 may be programmed to be in a shutoff state. The shutoff state of 1 Tr-type high dielectric non-volatile memory 56 may correspond to entering a "0" in 1 Tr-type high dielectric non-volatile memory 56.

When using a semiconductor memory incorporating shutoff signal generation circuit 1", control circuit 54 may set node 55 to a high logic level. Therefore, when 1 Tr-type high dielectric non-volatile memory 56 is placed in the shutoff state, shutoff signal generation circuit 1" may operate in a similar manner as shutoff signal generation circuit 1 whose fuse 12 has been blown.

On the other hand, if in step S01 in the inspection process, memory block 3 is inspected and found not to be defective, 1 Tr-type high dielectric non-volatile memory 56 may be programmed so that 1 Tr-type high dielectric non-volatile memory 56 may be conductive. The conductive state of 1 Tr-type high dielectric non-volatile memory 56 may correspond to entering a "1" in 1 Tr-type high dielectric non-volatile memory 56.

When using a semiconductor memory incorporating shutoff signal generation circuit 1", control circuit 54 may set node 55 at a high logic level. Therefore, when 1 Tr-type high dielectric non-volatile memory 56 is placed in the conductive state, shutoff signal generation circuit 1" may operate in a similar manner as shutoff signal generation circuit 1 whose fuse 12 is intact.

1 Tr-type high dielectric non-volatile memory 56 may be repeatedly converted from the conductive state to the shutoff state, or vice versa. A shutoff signal generation circuit 1" using 1 Tr-type high dielectric non-volatile memory 56 may increase the degree of freedom of using the semiconductor memory.

1 Tr-type high dielectric non-volatile memory 56 may be replaced with a 1-bit electrically erasable programmable read-only memory (EEPROM). Also, shutoff signal gernaeration circuit 1" may be constructed using a one transistor-one capacitor (1T1C) type high dielectric memory cell or a two transistor-two capacitor (2T2C) type high dielectric memory cell, as just two examples.

Figure 10:
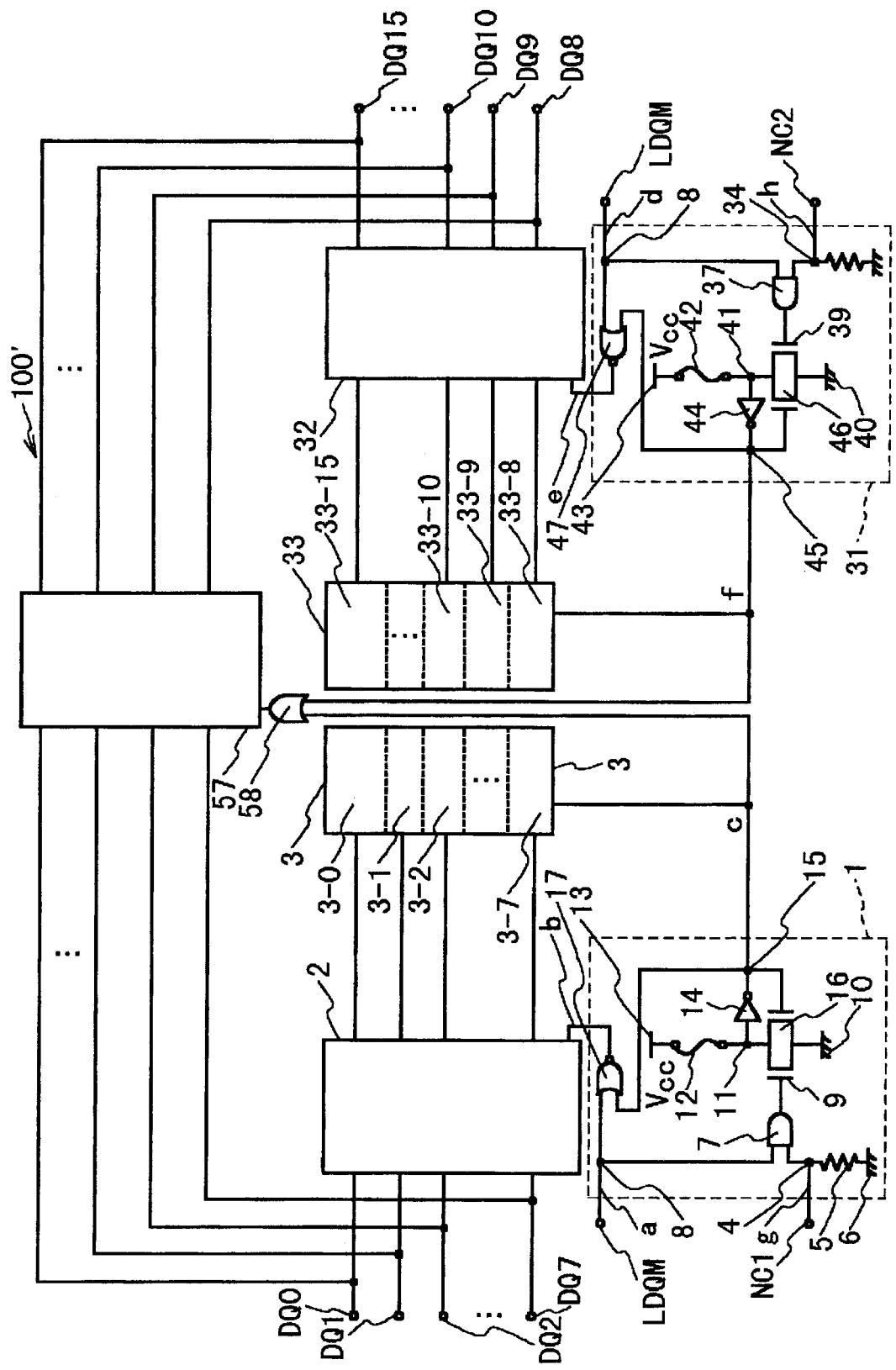
FIG. 10 is a circuit schematic diagram of a shutoff signal generation circuit according to an embodiment.

Referring now to FIG. 10, a circuit schematic diagram of a semiconductor memory according to an embodiment is set forth and given the general reference character 100'.

Semiconductor memory 100' may have similar constituents to semiconductor memory 100 illustrated in FIG. 1. To that extent, similar constituents will be referred to by the same reference character and a description of their detailed structures may be omitted.

Semiconductor memory 100' may include a connection circuit 57 and OR gate 58.

OR gate 53 may compute a logical sum of memory stop signal c and memory stop signal f and may output a result to connection circuit 57. When at least one of memory stop signals (c and f) is at a high logic level, connection circuit 57 may connect terminals (DQ0 to DQ7) to terminals (DQ15 to DQ8), respectively.

On the other hand, when memory stop signals (c and f) are both at logic low levels, connection circuit 57 may electrically disconnect terminals (DQ0 to DQ7) from terminals (DQ15 to DQ8), respectively.

Memory stop signal c may be at a high logic level when fuse 12 is blown. Memory stop signal f may be at a high logic level when fuse 42 is blown. Therefore, when at least one of fuses (12 and 42) is blown, terminals (DQ0 to DQ7) may be connected to terminals (DQ15 to DQ8), respectively.

Figure 11:
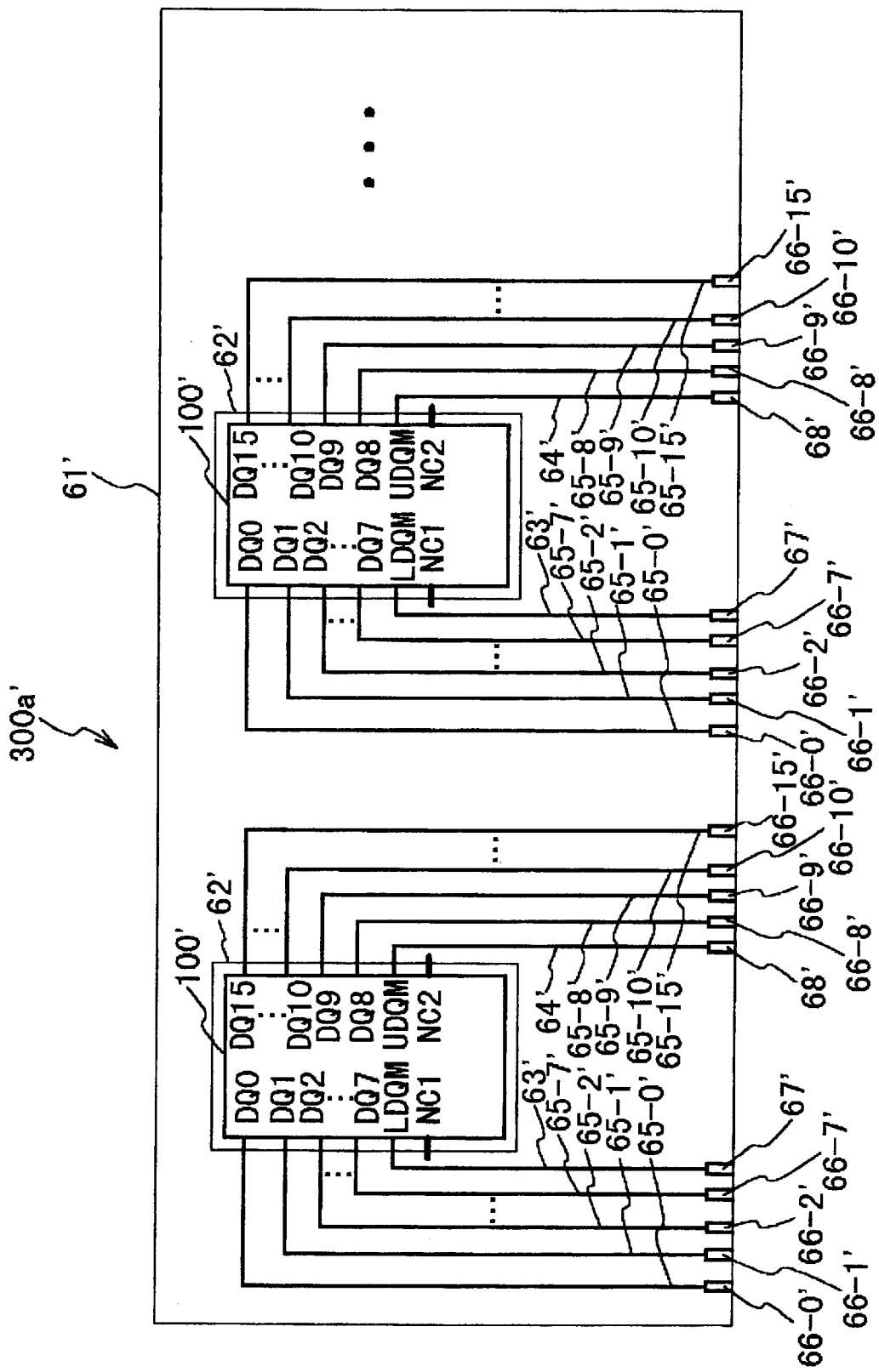
FIG. 11 is a block diagram of a circuit board according to an embodiment.
Figure 12:
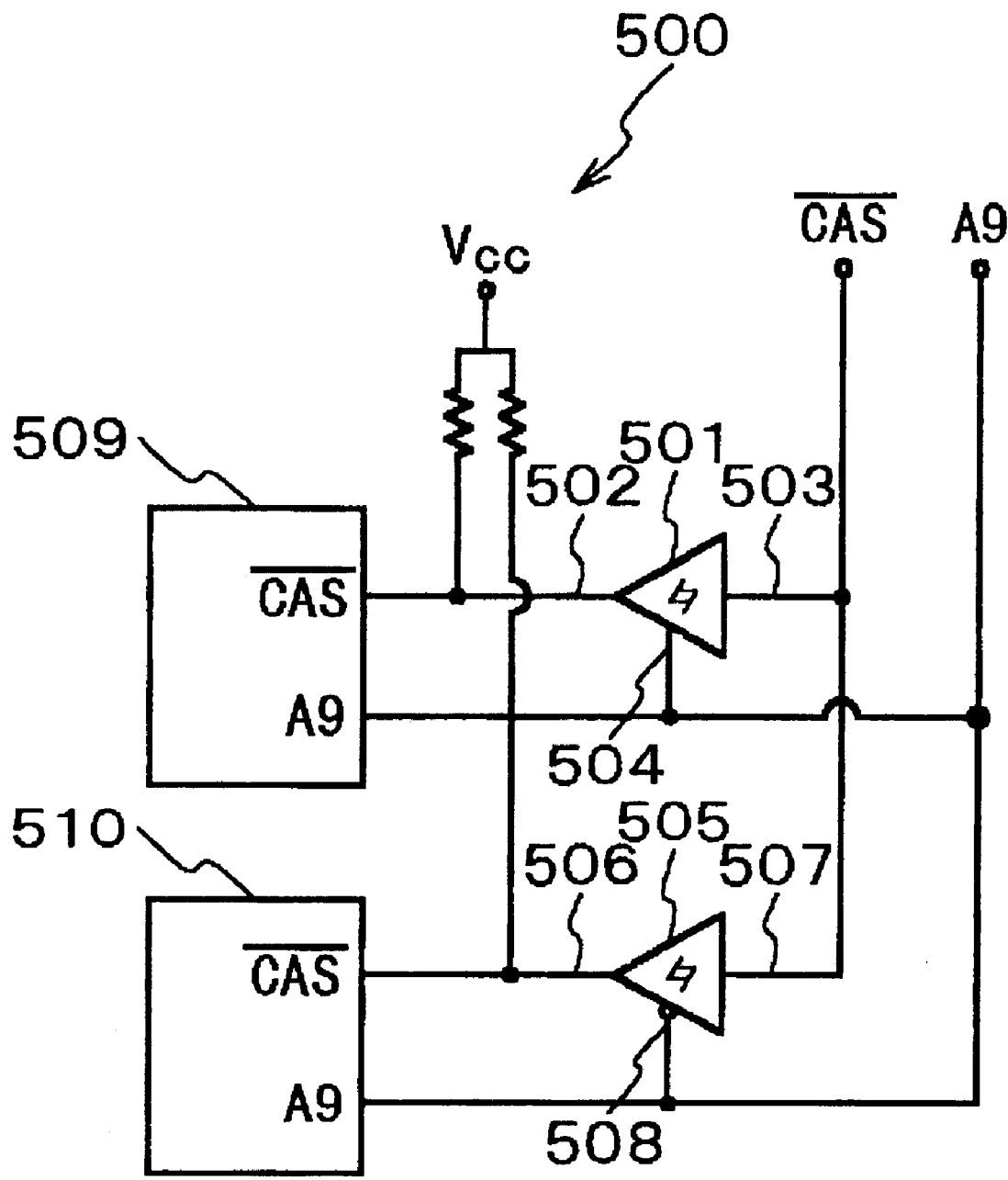
FIG. 12 is a circuit schematic diagram of a conventional semiconductor circuit.

Referring now to FIG. 11, a block diagram of a circuit board according to an embodiment is set forth and given the general reference character 300a'.

Semiconductor memory 100' may be used on circuit board 300a' illustrated in FIG. 11. Circuit board 300a' may be provided with a substrate base 61'. Substrate base 61' may be provided with a mounting section 62'.

On substrate base 61', wirings (63', 64', and 65-0' to 65-15') may be provided. Wirings (63', 64', and 65-0' to 65-15') may connect to board terminals (67', 68', and 66-0' to 66-15'), respectively.

Semiconductor memory 100' may be mounted on mounting section 62'. Fuses (12 and 42) contained in semiconductor memory 100' may or may not be blown. Wiring 63 may connect to terminal LDQM of semiconductor memory 100'. Wirings (65-0' to 65-15') may connect to terminals (DQ0 to DQ15) of semiconductor memory 100'.

When neither memory block 3 nor memory block 33 of semiconductor memory 100' is defective and neither of fuses (12 and 42) is blown, terminals (DQ0 to DQ7 and DQ8 to DQ15) may not be connected. Semiconductor memory unit 100' may operate as a parallel memory having sixteen I/O terminals (DQ0 to DQ15). Signals may be transferred from terminals (DQ0 to DQ15) through board terminals (66-0' to 66-15'), respectively.

On the other hand, when either memory block 3 or memory block 33 is defective and one of fuses (12 and 42) is blown, terminals (DQ0 to DQ7) of semiconductor memory 100' may be connected to terminals (DQ0 to DQ15), respectively.

In this case, semiconductor memory unit 100' may operate as a parallel memory having eight I/O terminals (DQ0 to DQ7). Signals may be transferred from terminals (DQ0 to DQ7) through board terminals (66-0' to 66-7'), respectively. When one of fuses (12 and 42) is blown, signals appearing at terminals (DQ8 to DQ15) may be the same as those appearing at terminals (DQ0 to DQ7). Thus, semiconductor memory 100' may also use terminals (DQ8 to DQ15) as I/O terminals.

Accordingly, semiconductor unit 100' may be mounted on a circuit board 300a' whether or not fuse (12 or 42) is blown.

It is understood that the embodiments described above are exemplary and the present invention should not be limited to those embodiments.

For example, the memory blocks (3 and 33) may be memory blocks having separate logical address spaces instead of physically separated on an integrated circuit. A memory block (3 and 33) may by composed of numerous memory sub-arrays, as just one example.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory, comprising:
   a first memory;
   external terminals;
   a shutoff circuit that disrupts an electrical connection between the external terminals and the first memory when the first memory is defective; and
   a second memory formed integrally with the first memory that is not accessed by the external terminals.

2. The semiconductor memory according to claim 1, wherein:
   when the first memory is not defective, the shutoff circuit electrically connects the first memory and the external terminals in response to a mask input signal input externally into the semiconductor memory.

3. The semiconductor memory according to claim 1, wherein:
   the shutoff circuit stops the first memory from operating when defective.

4. The semiconductor memory according to claim 1, wherein:
   the shutoff circuit includes a state maintaining element and when the first memory is defective, the state maintaining element maintains a first state and when the first memory is not defective the state maintaining element maintains a second state; and
   the shutoff circuit disrupts an electrical connection between the first memory and external terminals in response to the state maintaining element maintaining the first state.

5. The semiconductor memory according to claim 4, wherein:
   when the state maintaining element maintains the second state, the shutoff circuit electrically connects the first memory and the external terminals in response to an externally input mask signal.

6. The semiconductor memory according to claim 4, wherein:
   the state maintaining element includes a fuse;
   the first state is a fuse blown state; and
   the second state is a fuse intact state.

7. The semiconductor memory according to claim 4, wherein:
   the state maintaining element includes a fuse;
   the first state is a fuse intact state; and
   the second state is a fuse blown state.

8. The semiconductor memory according to claim 1, further including:
   a memory board for mounting the semiconductor memory and a second semiconductor memory; and
   the semiconductor memory or second semiconductor memory is defective.

9. The semiconductor memory according to claim 8, wherein:
   the memory board includes
     first wirings that connect the external terminals to the semiconductor memory, and
     second wirings that connect second external terminals to the second semiconductor memory.

10. The semiconductor memory according to claim 9, wherein:

the first wirings are electrically shorted to the second wirings.

11. A semiconductor memory, comprising:

a first memory block;

a first switch circuit coupled between first external terminals and the first memory block;

a second memory block formed integrally with the first memory block;

a first shutoff signal generating circuit including a first programmable device wherein the first shutoff signal generation circuit outputs a first shutoff signal coupled to the first switch circuit and the first switch circuit electrically disconnects the first memory block from the first external terminals in response to the first shutoff signal;

a second switch circuit coupled between second external terminals and the second memory block, the second external terminals being different than the first external terminals; and a second shutoff signal generating circuit including a second programmable device wherein the second shutoff signal generation circuit outputs a second shutoff signal coupled to the second switch circuit and the second switch circuit electrically disconnects the second memory block from the second external terminals in response to the second shutoff signal.

12. The semiconductor memory according to claim 11, wherein:

the first programmable device is a fuse.

13. The semiconductor memory according to claim 12, wherein:

the fuse is blown by applying a current.

14. The semiconductor memory according to claim 12, wherein:

the fuse is blown by laser irradiation.

15. The semiconductor memory according to claim 11, wherein:

the first programmable device includes a programmable transistor.

16. The semiconductor device according to claim 11, wherein:

the first shutoff signal generates a first memory stop signal that is coupled to disable the first memory block and the second shutoff signal generates a second memory stop signal that is coupled to disable the second memory block.

17. The semiconductor memory according to claim 11, wherein:

the first shutoff signal generating circuit further includes a latch circuit for latching a programmed state of the first programmable device.

18. The semiconductor memory according to claim 11, wherein:

the first shutoff signal generating circuit includes a logic gate coupled to receive an externally applied mask signal and a signal indicating a programmed state of the first programmable device, the logic gate is coupled to generate the first shutoff signal.

19. A method for inspecting a semiconductor memory including a first and second memory integrally formed, external terminals, a shutoff circuit including a programmable device wherein the shutoff circuit electrically disconnects the external terminals from the first memory when the first memory is defective, comprising the steps of:

inspecting whether or not the first memory is defective; and setting the programmable device in a first state depending on whether or not the first memory is defective to alter the electrical connection between first external terminals from the first memory, wherein the first external terminals do not provide access to the second memory.

20. The method for inspecting a semiconductor memory according to claim 19, wherein the step of setting the programmable device in a first state further includes:

blowing a fuse depending on whether or not the first memory is defective.

21. The method for inspecting a semiconductor memory according to claim 19, wherein the step of setting the programmable device in a first state further includes:

blowing a fuse by applying a current through the fuse depending on whether or not the first memory is defective.

22. The method for inspecting a semiconductor memory according to claim 19, wherein the step of setting the programmable device in a first state further includes:

applying a first state programming signal to an external input terminal of the semiconductor memory depending on whether or not the first memory is defective.

* * * * *